United States Patent

Kobayashi et al.

Patent Number: 5,283,611
Date of Patent: Feb. 1, 1994

[54] IMAGE FORMATION DEVICE WITH WRINKLE FREE TRANSPORT OF FILM TYPE PHOTOSENSITIVE MEMBER

[75] Inventors: Atushi Kobayashi; Nobumasa Abe; Takashi Suzuki, all of Suwa, Japan

[73] Assignee: Seiko Epson Corporation, Tokyo, Japan

[21] Appl. No.: 786,488

[22] Filed: Nov. 1, 1991

[30] Foreign Application Priority Data

| Nov. 1, 1990 | [JP] | Japan | 2-296010 |
| Feb. 19, 1991 | [JP] | Japan | 3-024930 |
| Feb. 19, 1991 | [JP] | Japan | 3-024932 |
| Mar. 11, 1991 | [JP] | Japan | 3-044705 |
| Mar. 11, 1991 | [JP] | Japan | 3-044706 |
| Aug. 28, 1991 | [JP] | Japan | 3-217157 |

[51] Int. Cl.⁵ .................. G03B 27/32; G03B 27/52
[52] U.S. Cl. .................... 355/27; 355/106; 355/107
[58] Field of Search ............. 355/27, 106, 107

[56] References Cited

U.S. PATENT DOCUMENTS

| 4,322,158 | 3/1982 | Frias et al. | 355/27 |
| 4,653,890 | 3/1987 | Nordstrom et al. | 355/27 |
| 4,697,919 | 10/1987 | Hertel | 355/27 |
| 4,785,332 | 11/1988 | Nagumo et al. | 355/27 |
| 4,819,032 | 4/1989 | Nagumo | 355/27 |
| 4,841,343 | 6/1989 | Ranger et al. | 355/27 |
| 5,049,919 | 9/1991 | Sakakibara et al. | 355/27 |

FOREIGN PATENT DOCUMENTS

| 350310 | 1/1990 | European Pat. Off. |
| 2-106396 | 7/1990 | Japan . |
| WO83/04319 | 12/1983 | PCT Int'l Appl. . |

Primary Examiner—Monroe H. Hayes
Attorney, Agent, or Firm—Eric B. Janofsky

[57] ABSTRACT

An image formation device photocopying system that transports a film type medium (100) along a passageway (6) such that it encounters the image exposure assembly (4), developer assembly (7), and transfer pressure assembly (8) sequentially from supply cartridge (5), and forms a latent image on medium (100) by exposing an image on it in the image exposure assembly (4), after which it heat develops the latent image in developer assembly (7) and transfers the developed image (100) to the transfer medium (102) in the transfer pressure assembly (8). A tensioning means (26) that applies tension to medium (100) being transported in passageway (6) on the upstream end or in supply cartridge (5).

15 Claims, 8 Drawing Sheets

IMAGE FORMATION DEVICE WITH WRINKLE FREE TRANSPORT OF FILM TYPE PHOTOSENSITIVE MEMBER

BACKGROUND OF THE PRESENT INVENTION

The present invention relates to image formation devices printers, plotters, facsimile machines, and other imaging/copying/printing devices that form images by using a photosensitive transfer type heat developing mediums and their photosensitive medium shuttle methods.

1. Description of the Prior Art

Color image formation device, such as is disclosed in Japanese Laid-Open Patent Publication 62-147461, have a photosensitive medium supply section, an exposure section, a heat developing section, a pressure transfer section and a photosensitive medium disposal section are provided along the medium pathway. Photosensitive medium is stored rolled up on a drum (roll), and sheets are cut an appropriate length for immediate use in an exposure assembly. There, light reflected from an original document is focused to form a latent image on the medium. Heat, at 80° to 200° C. applied for about 30 seconds, is then used to develop the image. A pressure transfer section presses together the photosensitive medium with a transfer medium (e.g., paper). The developed image transfers because of the pressure. The two mediums are then separated, the printed image is output to a stacking bin and the used photosensitive medium is wound up on a spool.

Photosensitive mediums typically use plastic films for their base layer. The surface is coated with a variety of microcapsules filled with a photosensitive solution and various color pigments. A photo-reaction occurs during exposure and heat in a developer causes certain color pigments to become selectively hardened, depending on the image and its colors. During pressure transfer, both photo-reacted and non-photoreacted microcapsules are crushed. The pigments that were not selectively hardened by the exposure and development will be transferred, thus forming an output image.

Prior art devices that cut the photosensitive medium first and then use it have very complex paper and film handling mechanisms, and copy output delays. It would be better to have the photosensitive medium spooled between two rolls such that it can be used in a continuous belt, without the need to cut the medium into sheets, developing time would be shortened. But it is not that simple, the problems spelled out below can be expected in a continuous belt system.

When a photosensitive medium is heated to the high temperatures needed for developing, wrinkling in the medium is a major problem. The high heat causes thermal stretch and shrink. The longitudinal dimension changes can be absorbed by the spooling, but the changes in the width are harder to deal with. So lengthwise wrinkles are almost unavoidable. Three distinct temperature states in the medium occur while it is in the vicinity of the heat developer. Residual distortions from the process of making the medium can remain in the medium, so wrinkles may not disappear even after the medium has been sufficiently cooled. In other words, the pressure transfer stage may not be able to avoid wrinkles, which can degrade the quality of the output image. The effect of very small wrinkles can be compensated for by adjusting the developing time or transfer pressure. Small wrinkles can cause photosensitive medium to lift, which causes uneven exposures.

Experiments have been run regarding wrinkles in mediums based on polyethylene terephthalate (PET) film. In one test, tension that was applied to the medium was increased in steps. Observations were taken for the number of wrinkles and the amount of thermal shrinkage. A photosensitive medium 215 mm wide was used. The heat developing temperature was a constant 150° C., and the shuttle speed of photosensitive medium was 10 mm/s. Normally, transfer pressure is applied without the aid of heat. But in a second experiment, wrinkles for various heat developing temperatures and pressure transfer temperatures were tried while the shuttle speed was varied to inject a variety of delays between development and image transfer points in time. The results of the first experiment are shown in Table I and those of the second experiment in Table II.

TABLE I

| Film tension | Thermal shrinkage of photosensitive medium | | Uneven exposure due to wrinkles caused by thermal shrinkage |
|---|---|---|---|
| | Lengthwise direction | Widthwise direction | |
| 0 gf | 1.2% | 0.7% | bad |
| 200 | 1.1 | 0.6 | bad |
| 400 | 0.8 | 0.5 | acceptable |
| 600 | 0.5 | 0.5 | Good |
| 800 | 0.5 | 0.5 | Good |

TABLE II

| Heat developing temp. | Pressure transfer temp. | Wrinkling versus time delay between developing and transfer | | | | |
|---|---|---|---|---|---|---|
| | | 1 sec | 2 sec | 5 sec | 10 sec | 20 sec |
| 155° C. | 30° C. | none | none | none | none | small |
| 155° C. | 50° C. | none | none | none | none | wrinkled |
| 155° C. | 70° C. | none | none | none | small | wrinkled |
| 155° C. | 90° C. | none | none | none | small | wrinkled |
| 155° C. | 110° C. | none | none | small | wrinkled | wrinkled |
| 135° C. | 50° C. | none | none | none | none | wrinkled |
| 135° C. | 70° C. | none | none | none | small | wrinkled |
| 135° C. | 90° C. | none | none | small | wrinkled | wrinkled |

According to Table I, wrinkles (and the problems caused by them) can be eliminated by applying a constant tension to the medium. The amount of thermal shrinkage can be limited to less than one percent. Preferably, tension should be applied both the length and width, to balance the changes in two dimensions. According to Table II, wrinkles can be minimized by pressure transferring much cooling has occurred after heat developing. The temperature difference between a heat developing temperature and a pressure transfer temperature, divided by the shuttle time in seconds from the heat developer to the point of transfer pressure, should be greater than 10° C. The reason for this is the photosensitive medium will stretch again if it has to be reheated, such as can occur when it has been allowed to cool after developing.

SUMMARY OF THE PRESENT INVENTION

An embodiment of the present invention comprises a color image formation device that transports a film type photosensitive medium along a pathway such that it sequentially encounters an image exposure assembly, a developer assembly, and a transfer pressure assembly. From the image medium supply, and forms a latent image on photosensitive medium by exposing an image on it in the image exposure assembly, after which it heat develops the latent image in the developer assembly and transfers the developed image to the transfer medium in the transfer pressure assembly, wherein a tensioning means that applies tension to photosensitive medium being transported in the medium pathway ahead of the developer assembly or in the image medium supply.

Here, the tensioning means should be disposed between the image exposure assembly and the developer assembly or between the image medium supply and the image exposure assembly, or the image exposure assembly, developer assembly and transfer pressure assembly should be disposed inside the main device unit, the image medium supply should be configured such that it can be freely detached from and attached to the main device unit and the tensioning means should be disposed in the image medium supply.

In these cases, the tensioning means should comprise a pair of rollers disposed such that photosensitive medium is sandwiched between them and a torque limiter that is connected to the rollers and applies damping torque, or a drive motor that supplies photosensitive medium, a sensor that comes in contact with photosensitive medium and detects the tension of photosensitive medium and a controller that controls the amount of photosensitive medium supplied by the drive motor based on the detection value of the sensor, or a supply roller on which is rolled the supplied photosensitive medium and a torque limiter that is connected to the axis of rotation of supply roller and applies a damping torque to supply roller.

An embodiment of the present invention comprises an color image formation device that transports a film type photosensitive medium along a medium pathway such that it faces the image exposure assembly, developer assembly and transfer pressure assembly sequentially from the image medium supply, and forms a latent image on photosensitive medium by exposing an image on it in the image exposure assembly, after which it heat develops the latent image in the developer assembly and transfers the developed image to the transfer medium in the transfer pressure assembly, wherein the developer assembly has a heating medium that comes in contact with photosensitive medium from the rear and heats photosensitive medium, and the heating medium has a curved friction surface that comes in direct contact with photosensitive medium and regulates the stretching and shrinkage of photosensitive medium by means of the frictional force generated between it and photosensitive medium.

Here, the curved friction surface of the heating medium should be a metal roller whose surface is polished, and a charger should be attached to roller. Further, the curved friction surface of the heating medium should be configured from a roller made from a heat conductive material whose surface is covered with a heat-resistant rubber.

It is desirable to dispose a guide medium in the image exposure assembly such that it comes in direct contact with photosensitive medium and regulates stretching or shrinkage of photosensitive medium by the frictional force generated between it and photosensitive medium, in which case the guide medium is a belt type exposure platform that rotates freely with the travel of photosensitive medium and whose surface, at least, comprises a rubber material. Similarly, it is desirable to dispose a guide medium between the image exposure assembly and the developer assembly such that it comes in direct contact with photosensitive medium and regulates stretching or shrinkage of photosensitive medium by the frictional force generated between it and photosensitive medium, in which case the guide medium is a belt type exposure platform that rotates freely and whose surface, at least, comprises a rubber material.

An embodiment of the present invention comprises a photosensitive medium shuttle method for color image formation devices that uses the color copier in claim 12 or 14 and rewinds the unexposed part of photosensitive medium back up to the image exposure assembly after completion of the image formation operation, wherein photosensitive medium is wound back up until the boundary part between the unexposed part and exposed part of photosensitive medium is positioned near the downstream end of the guide medium.

An embodiment of the present invention comprises an color image formation devices that transports a photosensitive medium having a polyethylene terephthalate film as a base layer along a medium pathway such that it faces the image exposure assembly, developer assembly and transfer pressure assembly sequentially from the image medium supply, and forms a latent image on photosensitive medium by exposing an image on it in the image exposure assembly, after which it heat develops the latent image in the developer assembly and transfers the developed image to a transfer medium in the transfer pressure assembly, wherein the medium pathway has a shuttle means that transports photosensitive medium along the medium pathway, and the shuttle means is such that at least the shuttle speed from the developer assembly to the transfer pressure assembly can be controlled such that $T/t > 10°$ C./s, where T is the temperature difference between the temperature to which photosensitive medium is heated in the developer assembly and the temperature to which it is heated in the transfer pressure assembly and t is the time required to shuttle photosensitive medium from the developer assembly to the transfer pressure assembly.

An embodiment of the present invention comprises a photosensitive medium shuttle method for color image formation devices that use a photosensitive medium having a polyethylene terephthalate film as a base layer and transports photosensitive material along a medium pathway in steps from the image medium supply to the image exposure assembly, developer assembly and transfer pressure assembly such that a latent image is formed on photosensitive medium by exposing an image on it in the image exposure assembly, after which the latent image is heat developed in the developer assembly and the developed image is transferred to a transfer medium in the transfer pressure assembly, wherein photosensitive medium is transported from the developer assembly to the transfer pressure assembly at a shuttle speed such that $T/t > 10°$ C./s, where T is the temperature difference between the temperature to which photosensitive medium is heated in the developer assembly and the temperature to which it is heated in the transfer pressure assembly and t is the time required to shuttle photosensitive medium from the developer assembly to the transfer pressure assembly.

An embodiment of the present invention comprises an color image formation device that transports a photosensitive medium having a polyethylene terephthalate film as a base layer along a medium pathway such that it faces the image exposure assembly, developer assembly and transfer pressure assembly sequentially from the image medium supply, and forms a latent image on photosensitive medium by exposing an image on it in the image exposure assembly, after which it heat develops the latent image in the developer assembly and transfers the developed image to a transfer medium in the transfer pressure assembly, wherein a tensioning means that applies tension to photosensitive medium facing the developer assembly is provided ahead of the developer assembly, and the tensioning means is such that it can control the tension such that thermal shrinkage in the lengthwise direction of photosensitive medium facing the developer assembly is less than one percent. Here, it is desirable that the tensioning means be configured such that it is capable of controlling the tension such that thermal shrinkage in the lengthwise direction and that in the widthwise direction of photosensitive medium facing the developer assembly generally agree.

An embodiment of the present invention comprises a photosensitive medium shuttle method for color image formation devices that use a photosensitive medium having a polyethylene terephthalate film as a base layer and transports photosensitive material along a medium pathway in steps from the image medium supply to the image exposure assembly, developer assembly and transfer pressure assembly such that a latent image is formed on photosensitive medium by exposing an image on it in the image exposure assembly, after which the latent image is heat developed in the developer assembly and the image developed on photosensitive medium is transferred to a transfer medium in the transfer pressure assembly, wherein at least photosensitive medium facing the developer assembly is transported with tension applied such that thermal shrinkage in the lengthwise direction of photosensitive medium is less than one percent. Here, it is desirable that photosensitive medium facing the developer assembly be transported with tension applied such that thermal shrinkage in the lengthwise direction and that in the widthwise direction generally agree.

By providing a tensioning means that applies tension to photosensitive medium being transported, it is possible to apply tension to photosensitive medium in addition to the shuttle force. Thermal stretching or thermal shrinkage is generated in photosensitive medium passing through the developer assembly as a result of heating. The stretching force or shrinking force due to thermal stretching or thermal shrinkage acts in all directions in minute parts of photosensitive medium, but as change in the shape of photosensitive medium, it appears as elongation or shortening in the lengthwise direction (shuttle direction) or widthwise direction. Of this change, elongation or shortening in the lengthwise direction is absorbed by minute changes in the shuttle speed, but elongation or shortening in the widthwise direction causes wrinkles. That is, elongation or shortening in minute parts of photosensitive medium appear as changes in shape on both sides of photosensitive medium. This means that even though stress may act uniformly in each part of photosensitive medium, shape changes in the middle and on the sides will differ. Therefore, as long as no shape changes occur in photosensitive medium after heating, the balance in residual stress will be lost and wrinkles will not be eliminated. On the other hand, though the width of photosensitive medium after heating is different from that before heating due to the change in shape, the transitional part from before to after heating becomes a trapezoidal shape since photosensitive medium is continuously transported. That is, the side edges of photosensitive medium from before to after heating become slanted, thus resulting in an overall funnel shape or reverse funnel shape. Also, tension is applied to this part in the lengthwise direction by the tensioning means. This tension generates a component force of the cosine of the angle of the slant of the slanted side parts. This component force acts in the direction opposite that of the stretching force or the shrinking force. Therefore, this component force works to cancel out the wrinkle-forming stretching force or shrinking force. Further, by providing a tensioning means between the image medium supply and the image exposure assembly, the tension can also be made to act on photosensitive medium positioned in the image exposure assembly, thus preventing lifting or meandering and facilitating accurate exposure on photosensitive medium.

By providing the heating medium of the developer assembly with a curved friction surface that regulates stretching and shrinkage of photosensitive medium by means of frictional force, the direction of shuttle of photosensitive medium can be changed and stretching or shrinkage can be regulated over a larger contact area. Here, by further providing a guide medium in the image exposure assembly or between the image exposure assembly and the developer assembly that regulates stretching and shrinkage of the photo sensitive medium, the effect of wrinkles generated in the developer assembly can be eliminated in the image exposure assembly.

By returning photosensitive medium to near the downstream end of the guide medium, waste of photosensitive medium is avoided, and even if wrinkles should occur in the boundary part of photosensitive medium, the effect of wrinkles on photosensitive medium positioned in the image exposure assembly is eliminated by the guide medium.

By configuring the device such that the shuttle speed of photosensitive medium from the developer assembly to the transfer pressure assembly is $T/t > 10°$ C./s, pressure transfer can be performed before cooling of photosensitive medium after heat developing proceeds too far, thus yielding the above-mentioned experimental results.

By keeping the amount of thermal shrinkage in the lengthwise direction of photosensitive medium to less than one percent by means of the tensioning means, a wrinkle prevention effect can be achieved that is sufficient to yield the above-mentioned experimental results.

Other objects and attainments together with a fuller understanding of the present invention will become apparent and appreciated by referring to the following description and claims taken in conjunction with the accompanying drawings.

DETAILED DESCRIPTION OF THE PREFERRED EMBODIMENTS

Figure 1:
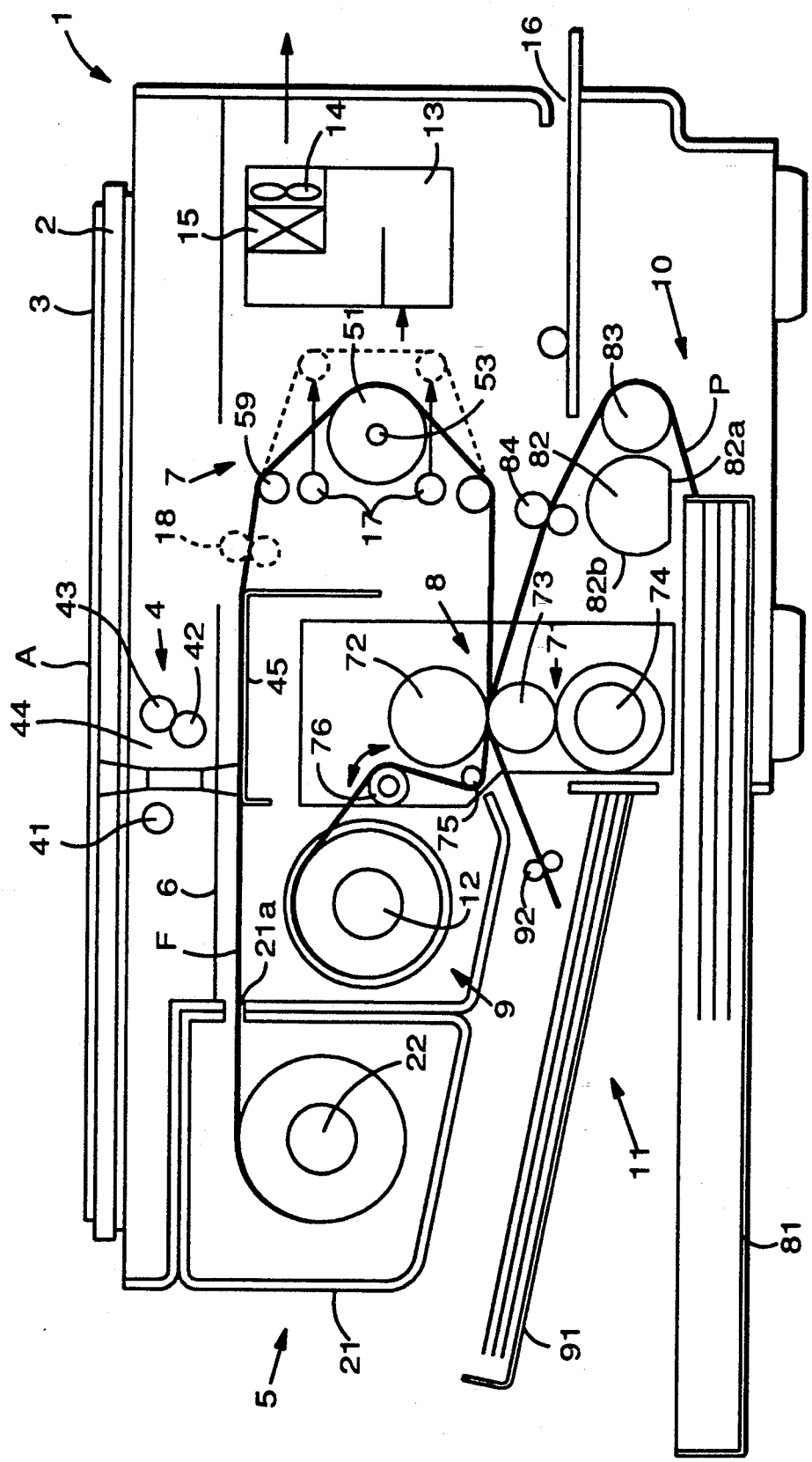
FIG. 1 is a cutaway view of an embodiment of a color image formation device in which the present invention is implemented.

In FIG. 1, a image formation system 1, an embodiment of the present invention, has a document exposure plate 2 made of glass and a cover 3 hinged in such a way that it can stand up open. An original document 104 is set on document exposure plate 2 and copied while under cover 3. An image exposure assembly 4 focuses a high intensity image of document 104 onto a photosensitive medium 100, which is just inside system 1 below exposure plate 2. An image medium supply 5 is positioned ahead of image exposure assembly 4. Supply cartridge 5 is a plug-in unit that houses a fresh roll of a photosensitive medium 100, and can be freely attached and detached from system 1. Photosensitive medium 100 moves along a passageway 6, as needed, as it sequentially encounters image exposure assembly 4, developer assembly 7, transfer pressure assembly 8, and medium spooling assembly 9. Passageway 6 opens onto developer assembly 7. Each assembly in system 1 is preferably positioned to keep the system as compact as possible. Photosensitive medium 100 moves from supply cartridge 5 along passageway 6 and is exposed with a latent image in exposure assembly 4. Developer assembly 7 causes the latent image to be developed by heating medium 100 to about 150° C. A sheet of paper 102 is aligned with the now developed image on medium 100 and proceeds to a transfer pressure assembly 8. Paper 102 comes from a supply assembly 10 at the bottom of system 1. The developed image is transferred to paper 102 by pressure. This stage resembles printing newspaper with inked rollers, because liquid ink from the microcapsules is actually what is being transferred. Medium 100 and paper 102 are separated, and used medium 100 is spooled into assembly 9. It will later be returned to roller 22 when the whole of medium 100 has been used. Paper 102, now carrying the printed image positive, moves on to outlet assembly 11 to be stacked in bin 91 for the user.

The typical photosensitive medium 100 supplies available comprise a polyethylene terephthalate (PET) film, as a base layer, and has microcapsules on its surface that are filled with a ink and a photosensitive solution (consisting mainly of silver halide, a reducing agent and a polymer compound). The solution is intended to photoreact with and harden the ink if exposed to light. Three inks typically used are yellow, magenta and cyan. Microcapsules of these colors are randomly mixed and thoroughly cover the surface of the film. PET film tends to shrink after it has been heated. Such shrinkage is a principal cause of residual distortion. Annealing is sometimes used to relieve embedded stresses to relieve such distortion. Here, a 25 micrometer thick PET film is used that has been already been annealed, and so it shrinks only 0.5% after exposure to 150° C. heat.

On the left side of FIG. 1 is shown cartridge 5, which has a light-tight box 21 to keep photosensitive medium 100 fresh. Box 21 is capable of being attached/detached. A fresh supply of photosensitive medium 100 can be easily mounted (e.g., by a user). Used medium 100 is wound back up and can be removed. Medium 100 is a single length which is used in a continuous belt until the end is reached.

Image exposure assembly 4 comprises a red (R) lamp 41, a green (G) lamp 42, a blue (B) lamp 43, a converging lens 44, and an exposure platform 45 over which the photosensitive medium 100 shuttles across in its one-way trip to the developer. ("One-way" could include backing up a little to make the best use of medium 100, given the otherwise unused areas between exposures.) Lamps 41-43 direct light on document 104 when on exposure plate 2 via a mirror (not shown). The reflected light image is focused on the surface of photosensitive medium 100 by a lens 44 and the exposure time is controlled by a shutter (not shown). Document 104 shuttles back and forth on exposure plate 2, with photosensitive medium 100 moving in tandem on one of the strokes. The above comprises a so-called "scan exposure system."

Developer assembly 7 has a roller 51 is made of a heated roller 54 comprising a rotating main roller tube 52. A halogen lamp 53 is positioned inside tube 52 in order to heat it. The surface temperature of main roller tube 52 is controlled by switching halogen lamp 53 on and off, such that a temperature between 147° C. and 155° C. is maintained. Other mediums may require other temperatures. The backside of photosensitive medium 100 turns while in contact with the surface of main roller tube 52 for a certain number of degrees of arc, during which it is heated at a particular developing temperature, before turning back toward transfer pressure assembly 8. A halogen lamp heater is not strictly necessary, other kinds of heaters, such as infrared, rod-shaped ceramic, sheet-shaped, electrode induction, electromagnetic wave, or other, can also be used.

A transfer pressure assembly 8 comprises a roller assembly 71, which has a top roller 72, a middle roller 73 and a bottom roller 74. A separation roller 75 and a pinch roller 76 handle the paper and medium flows after transfer. Photosensitive medium 100 and paper 102 (to which the developed image will be transferred under pressure) are pinched and pressed together between the top and middle rollers 72 and 73. Preferably, the transfer temperature is around 70°±3° C. The speed is controlled such that medium 100 will have cooled to this temperature by the time it reaches assembly 8. The top and middle rollers 72 and 73 are made from metal or other hard material. The drive roller is roller 72. By forcefully sandwiching photosensitive medium 100 and paper 102 between both rollers 72 and 73, the transfer will be complete and uniform in appearance. The transfer actually crushes the microcapsules on photosensitive medium 100. A heavy, uniform pressure is necessary for good results. Bottom roller 74 is in contact under pressure with middle roller 73. When not doing a transfer, the middle and bottom rollers 73 and 74 swing away to an idle position. Separation roller 75 is positioned just downstream of assembly 71, and it separates medium 100 from paper 102. When photosensitive medium 100 must be moved, roller 76 is moved so that it pinches photosensitive medium 100 against top roller 72. Pinch roller 76 is a free, so top roller 72 provides the drive to medium 100. After separation, the used part of medium 100 is conducted to recovery assembly 9. The following combinations of transfer pressure and temperature have been found to give acceptable results:

1000 kg/cm² at 20° C.,
400 kg/cm² at 50° C.,
200 kg/cm² at 70° C., and
100 kg/cm² at 90° C.

When the last of medium 100 has been used up, but before it comes off of roller 22, a clutch switches to allow roller 12 to spin freely. Roller 22 is then driven in reverse to gather back the used medium 100 so it can be removed in box 21.

Paper supply 10 comprises a paper cassette 81 for cut sheet paper, a half-moon paper feed roller 82, a guide roller 83, and a paper supply roller 84 aimed at transfer pressure assembly 8. Paper supply cassette 81 slips easily in and out system 1 to receive more paper. Many different cassettes can be used for the various sizes of paper in use. Roller 82 has a straight part 82a and a curved part 82b, and boated are coated with a rubber. The edges between the straight part 82a and the curved part 82b will catch a leading edge of paper 102. As roller 82 turns, the curved part 82b will feed paper 102 the leading edge of the paper sheet reaches paper supply roller 84. Paper 102 is supplied in sync with the movements of medium 100 such that paper 102 matches its speed and is aligned with the exposed image for transfer.

Paper output assembly 11 comprises an ejected paper cassette 91, which holds a stack of cut sheets, and a pair of paper eject rollers 92, which guide paper 102 from transfer assembly 8 to paper cassette 91. Paper eject rollers 92 run slightly faster than rollers 84, so paper 102 is put under a tension counter any tendencies of paper 102 to wrinkle or jam.

In FIG. 1, an exhaust unit 13 comprises an air filter 15 that is built into an exhaust fan 14. Heat and gas generated in system 1 are exhausted by unit 13. A manual paper supply inlet 16 can be used for manually supplying sheets of paper 102.

The image formation device process completes when the exposed part of photosensitive medium 100 reaches transfer pressure assembly 8. However, in non-continuous copying use, an unexposed part will be sent to the transfer pressure assembly 8 along with an exposed part. When the next exposure occurs, an unexposed part between the image exposure assembly 4 to the transfer pressure assembly 8 will be wasted. Preferably, the unexposed part is returned to near the image exposure assembly 4 before the next exposure is allowed. A drive motor 23 (see FIGS. 4 and 5) is connected to supply roller 22 and can reverse itself. Photosensitive medium 100 can be rewind a bit until the start of the unexposed part reaches is in position.

Therefore, care should be exercised not to develop the unexposed part by allowing it to pass through developer assembly 7. To help, the contact between heat roller 51 and medium 100 is broken by moving in rollers 17 such that medium 100 is separated from heat roller 51 (see, FIG. 1). For one-at-a-time copying, movable rollers 17 are thus used until rewinding is completed.

Several mechanisms are used to prevent wrinkles from forming in medium 100. The wrinkles generally happen in developer assembly 7. The mechanisms used apply tension to photosensitive medium 100 in the length and width directions. Tension can be applied in the lengthwise direction by either regulating the movement of medium 100 or by applying tension directly. Tension can be applied in the widthwise direction by a bow shaped unit that puts pressure in the middle of medium 100.

Figure 2:
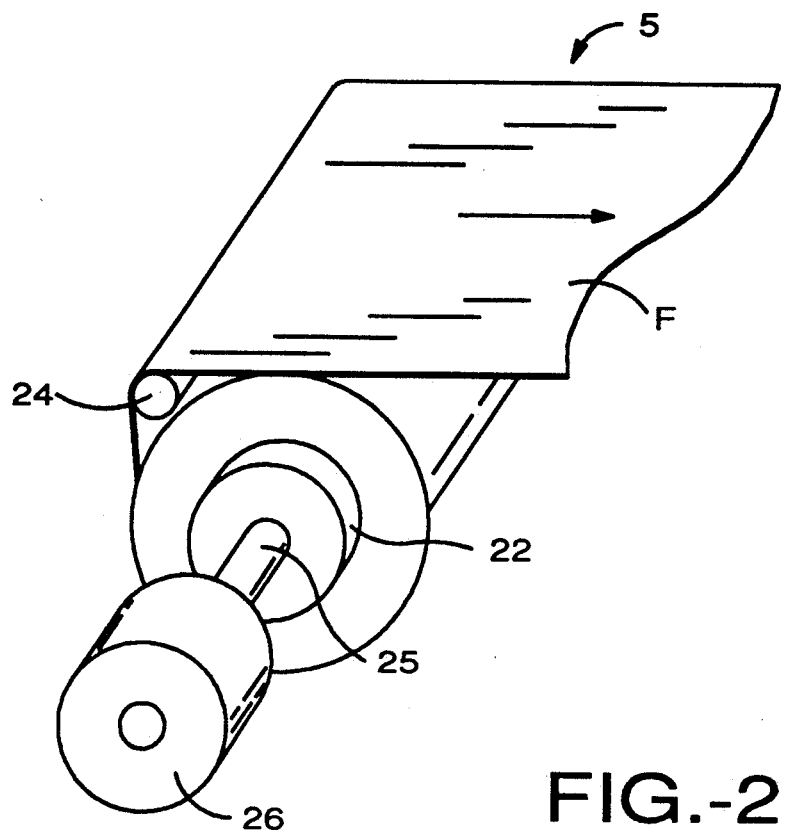
FIG. 2 is a first embodiment showing the vicinity of supply roller of the image medium supply.

FIG. 2 is a first embodiment of the present invention showing the area of supply roller 22. As shown, medium 100 is wound up on supply roller 22, and feeds out horizontally by the guide roller 24. A torque limiter 26 is attached to a axis 25 as a tensioning means. It damps any movement of medium 100 by inhibiting the torque of supply roller 22. The torque limiter 26 can be a friction clutch, a magnetic particle clutch or an electromagnetic clutch. The torque limiter is adjusted in advance to a desired tension. The tension acts on heat roller 51. In addition to its direct affect to prevent wrinkles, it also acts indirectly to prevent wrinkles by increasing the frictional forces on heat roller 51.

Figure 3:
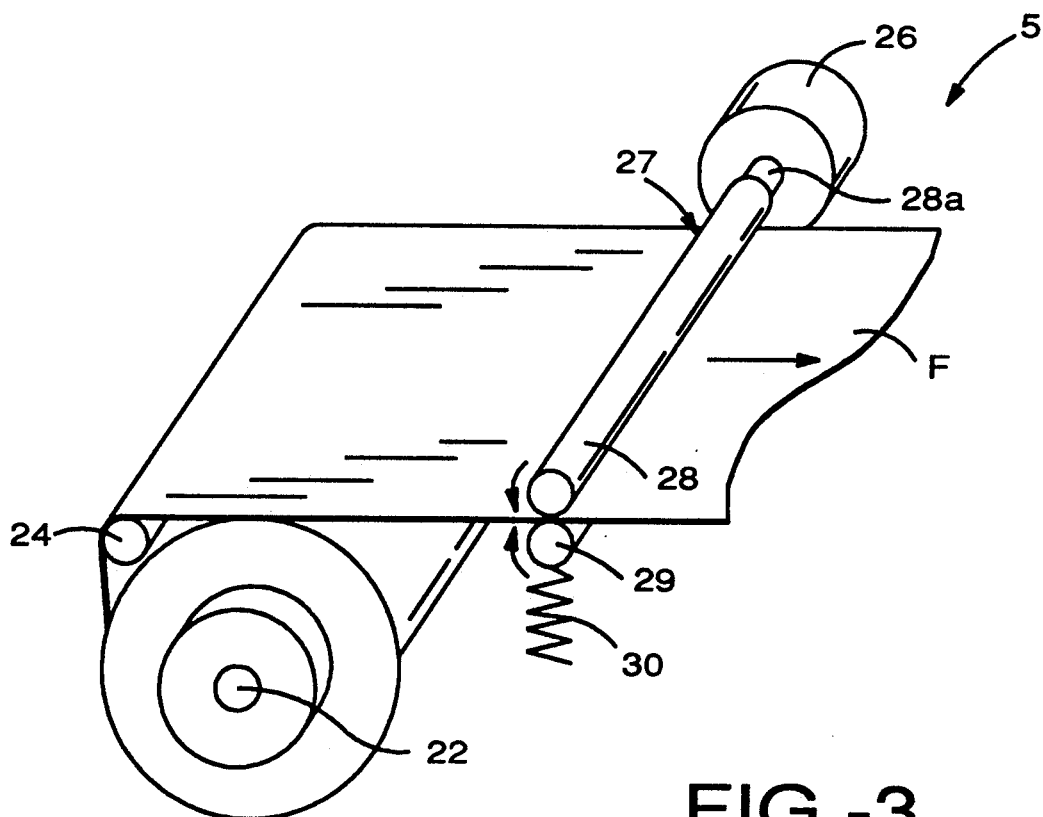
FIG. 3 is a second embodiment showing the vicinity of supply roller of the image medium supply.

FIG. 3 is a second embodiment of the present invention showing the area of supply roller 22. As shown, the feed rollers 27 are downstream from supply roller 22 such that medium 100 is sandwiched between them. These feed rollers comprise a friction roller 28, which applies frictional force to medium 100 for damping, and a load roller 29, which applies a feed load to the friction roller 28, and medium 100 is sandwiched between the two rollers 28 and 29. A torque limiter 26, like that above, is attached to the axis 28a of the friction roller 28, and the spring 30 is attached to the load roller 29 and pushes it against the friction roller 28. The dynamic frictional force of the friction roller 28 continually acts on medium 100 being transported, whereby tension is applied by means of damping. Here, the torque limiter 26 can be eliminated and damping achieved by the feed force and rotational friction of the rollers 28 and 20 acting on medium 100.

Figure 4:
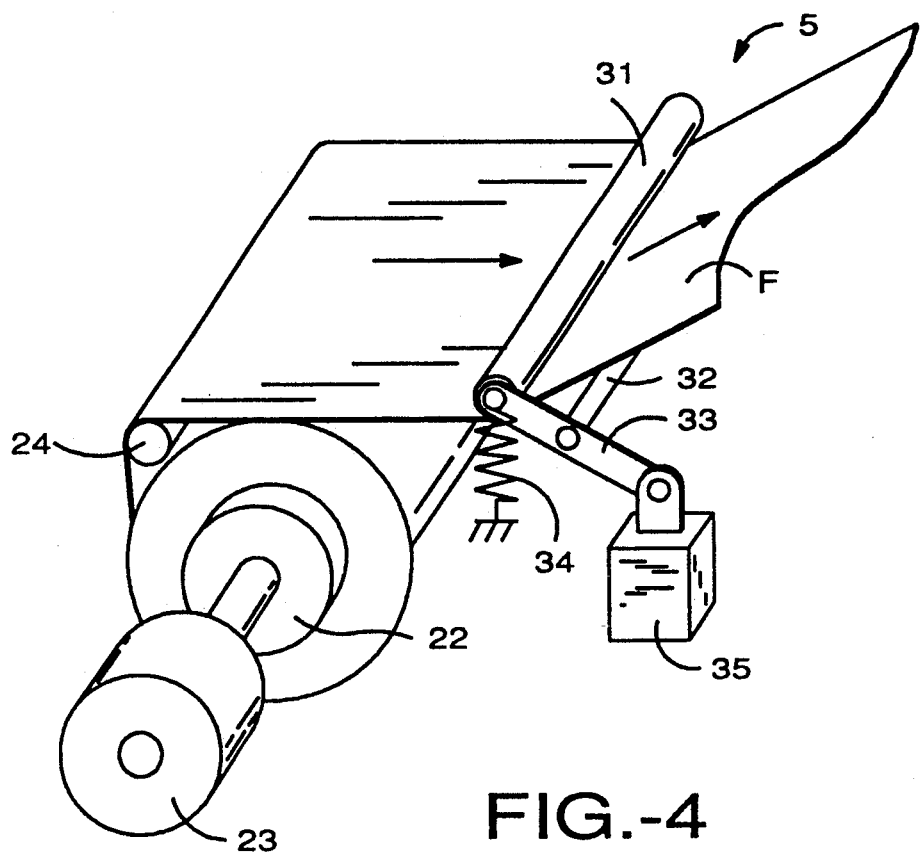
FIG. 4 is a third embodiment showing the vicinity of supply roller of the image medium supply.

FIG. 4 is a third embodiment of the present invention showing the area of supply roller 22. As shown, a loading roller 31 is downstream from supply roller 22. The loading roller 31 applies tension to medium 100 by pushing medium 100 down. Loading roller 31 is supported on one end of the rocker arm 33, which is supported by the rocker shaft 32, such that it can spin freely, and the load roller is pulled down by the extension spring 34. The position sensor 35 is attached to the other end of the rocker arm 33, and this position sensor 35 detects the force of the extension spring 34 as the rocker position of the loading roller 31. The drive motor 23 is attached to the axis 25 of supply roller 22, and the rotation of the drive motor 23 is controlled by a controller (not shown) such that the detected value of the position sensor remains constant. In this manner, the loading roller 31, extension spring 34, position sensor 35 and drive motor 23 make up the tensioning means such that a suitable tension is on medium 100. Here, a constant tension on medium 100 can be maintained regardless of the diameter of the rolled up medium 100.

Figure 5:
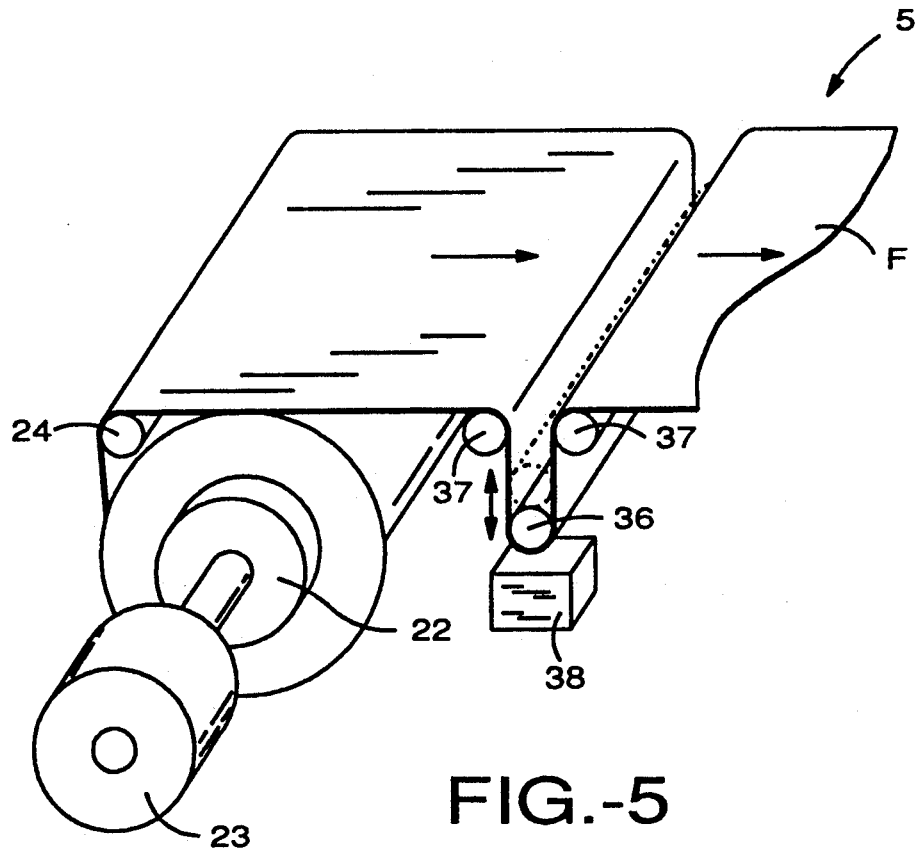
FIG. 5 is a fourth embodiment showing the vicinity of supply roller of the image medium supply.

FIG. 5 is a fourth embodiment of the present invention showing the area of supply roller 22. Here, a rolling roller 36 is downstream from supply roller 22 as in the third embodiment of the present invention, but this rolling roller simply rides on top of medium 100 and applies tension to medium 100 by its own weight. A pair of support rollers 37 and 37 are provided underneath medium 100 before and after the rolling roller 36 in order to support it indirectly. Further, the position sensor 38 is located near the end of the rolling roller 36, and changes in the tension due to the rolling roller 36 are detected by this position sensor 38. As in the third embodiment of the present invention, the drive motor 23 is attached to the axis 25 of supply roller 22, and the rotation of the drive motor 23 is controlled by a controller (not shown) such that the detected value of the position sensor 38 remains constant. In this way, the rolling roller 36, support rollers 37, position sensor 38 and drive motor 23 make up the tensioning means. Here, tension is applied by the weight of the rolling roller 36, and therefore a uniform tension acts on medium 100.

Figure 6:
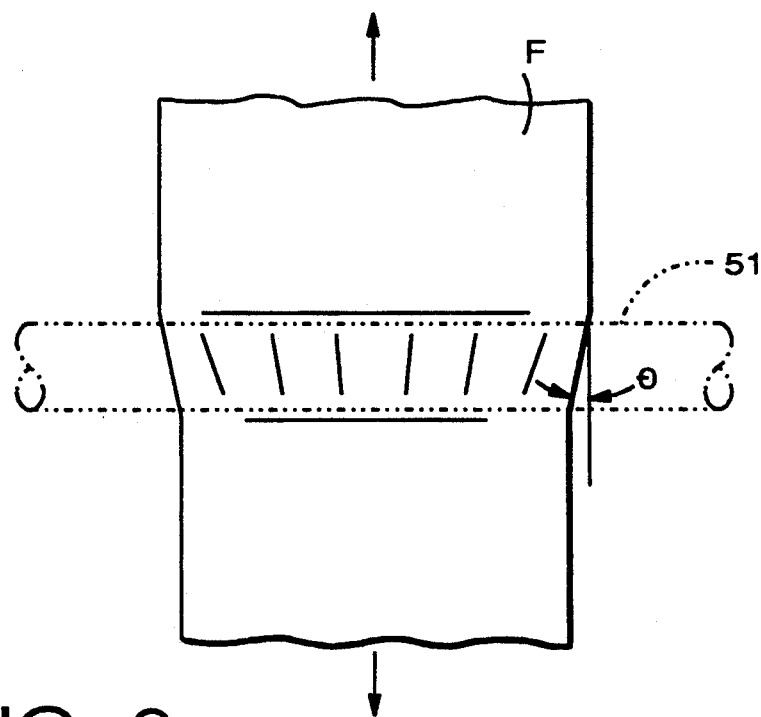
FIG. 6 is an explanatory diagram of the prevention of wrinkles in photosensitive medium.

As described above, by configuring a suitable tensioning means as shown in the above four embodiments such that a fixed tension is continually on medium 100 being transported, wrinkles in medium 100 generated in developer assembly 7 can be prevented. FIG. 6 is a diagram which explains the principle by which wrinkles in photosensitive medium are inhibited. The PET film, which serves as the base layer of medium 100, tends to shrink when heated, and as shown, it shrinks when its temperature rises as it comes in contact with the heat roller 51. Of this shrinkage, that in the lengthwise direction (movement direction) is absorbed by minute changes in the movement speed, but that in the widthwise direction appears as a change in the shape of medium 100, and this is the cause of so-called wrinkles. This change in shape appears as a trapezoidal shape centered on the contact of medium 100 with the heat roller 51. When tension is on medium 100 here, a component force equivalent to the cos $\theta$ of the tension is generated, where $\theta$ is the angle formed by edges of the trapezoidal shape with the edges of the other parts. This component force acts on the shrinking trapezoidal shape, and it acts in a direction that stretches medium 100 so as to cancel out the shrinkage force. The shrinkage force is suppressed, which in turn suppresses the generation of wrinkles.

The tension required here is shown in TABLE I, and the results show that a tension should be applied that keeps shrinkage to less than one percent in the lengthwise direction. As shown in the first to the fourth embodiments, the tension of the tensioning means is adjusted to keep shrinkage in the lengthwise direction of medium 100 to less than one percent and preferably to keep both shrinkage in the lengthwise direction and shrinkage in the widthwise direction the same 0.5%, or more specifically to 600 gf. This tension of about 600 gf is on medium 100 in the first and second embodiments by adjusting the load of the torque limiters 26 and 26 and in the third and fourth embodiments by adjusting the detection reference position of the position sensors 35 and 38.

In these embodiments, the tensioning means is positioned in supply cartridge 5. By positioning the tensioning means in supply cartridge 5, it can be freely attached to and detached from system 1, thus simplifying maintenance and tension adjustment. These tensioning means could, of course, be mounted between supply cartridge 5 and the image exposure assembly 4, or between the image exposure assembly 4 and developer assembly 7 (excluding the first embodiment of the present invention). By mounting the tensioning means between supply cartridge 5 and the image exposure assembly 4, the tension also acts on medium 100 positioned in the image exposure assembly 4, thus making it possible to prevent lifting or meandering of this part and facilitating accurate exposure. By positioning the tensioning means between the image exposure assembly 4 and developer assembly 7, on the other hand, it is not necessary to consider the weight of medium 100 in the application of the tension, thus making it possible to apply a stable, consistent tension. Moreover, by also mounting a feed roller in this part (positioned ahead of the tensioning means), the exposure speed of scan exposure can be stabilized in addition to preventing wrinkles.

Figure 7:
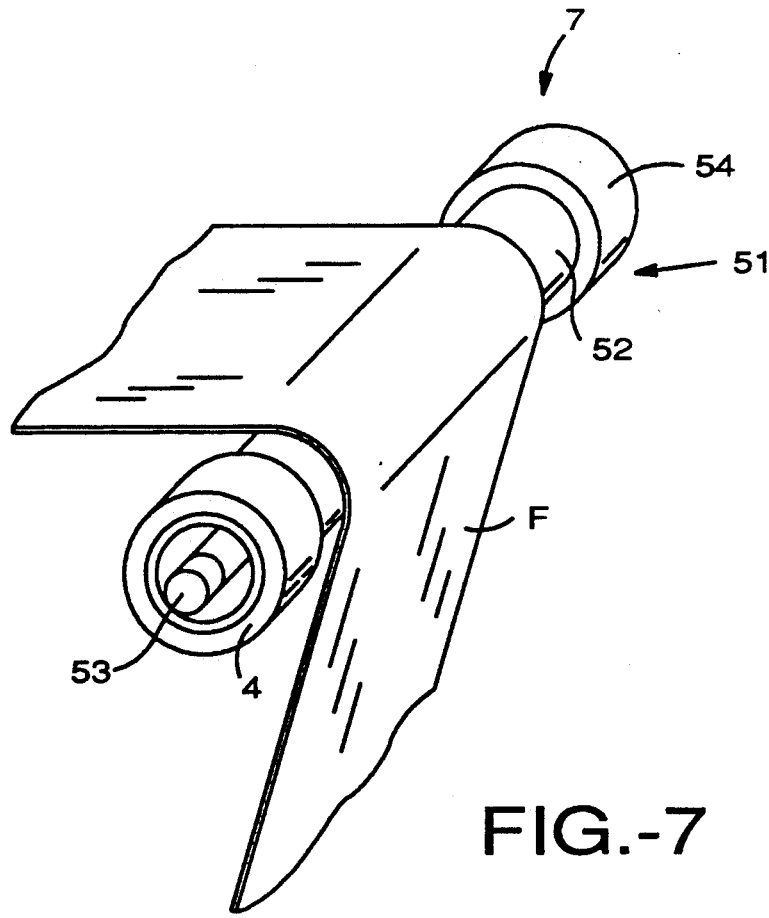
FIG. 7 is a fifth embodiment showing the vicinity of the heat roller of the developer assembly.

FIG. 7 is a fifth embodiment of the present invention showing the area of the heat roller in developer assembly. As shown, the heat roller 51 comprises a cylindrical roller tube 52 in which a halogen lamp 53 is inserted, and it is attached to the frame (not shown) of system 1 via a pair of bearings 54 and 54 on the ends of roller tube 52. Roller tube 52 makes up the curved friction surface of the heat roller 51, and it comes in direct contact with the rear surface of medium 100 on its peripheral surface. Roller tube 52 is made from aluminum or an aluminum alloy with good heat conductance such that it warms up smoothly, and the surface is polished such that sufficient frictional force can be achieved with respect to the film type medium 100. So, shrinkage of medium 100, particularly that in the widthwise direction due to heating by the heat roller 51 and the subsequent cooling, is inhibited by the static frictional force between photosensitive medium and roller tube 52.

Figure 8:
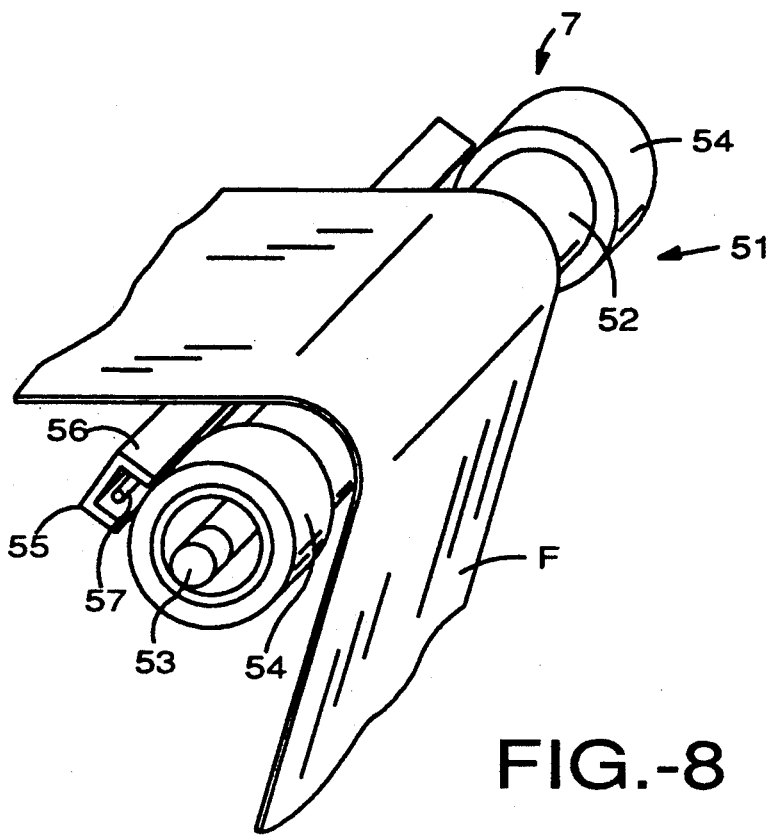
FIG. 8 is a sixth embodiment showing the vicinity of the heat roller of the developer assembly.

FIG. 8 is a sixth embodiment of the present invention showing the area of the heat roller in developer assembly. This embodiment of the present invention uses a structure that causes a static electric force to act on medium 100 in addition to the frictional force. As shown, the heat roller 51 is also provided with a charge assembly 55, which charges roller tube 52 of the heat roller 51 by corona discharge. An electric assembly 55 has a straight discharge wire 57 inside a case 56. A static electric force acts on medium 100 (via the charged roller tube 52) thereby causing a so-called "static cling" on medium 100. Both frictional and static electric forces will act on medium 100 at the same time across the width to inhibit wrinkling. Discharge wire 57 can be made of gold, platinum, or carbon-coated tungsten.

Figure 9:
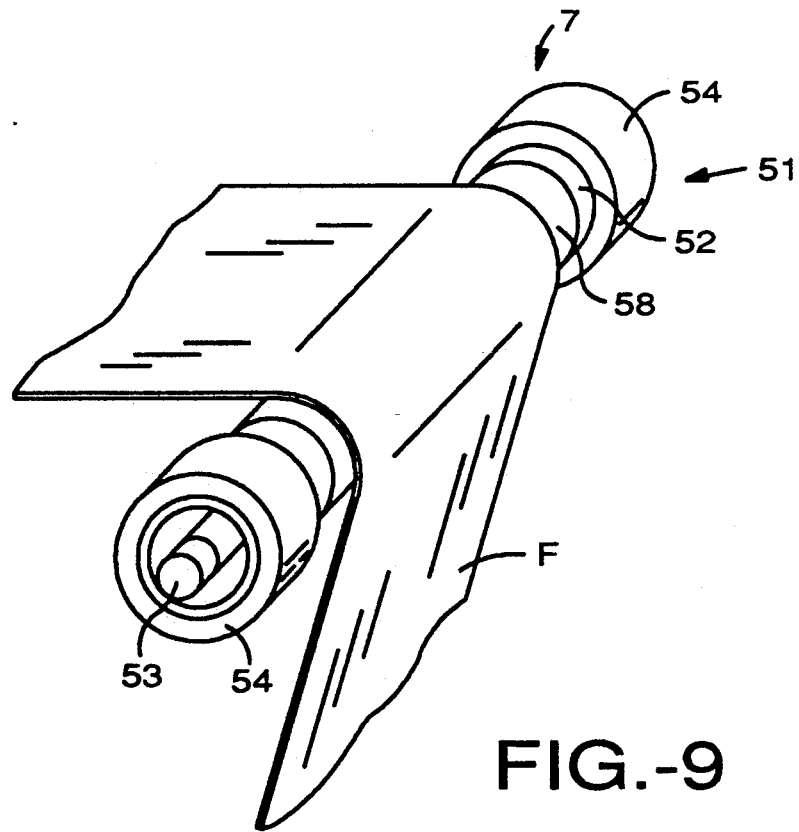
FIG. 9 is a seventh embodiment showing the vicinity of the heat roller of the developer assembly.

FIG. 9 is a seventh embodiment of the present invention showing the area of the heat roller in developer assembly. Here, roller tube 52 of the fifth embodiment of the present invention is covered with a heat-resistant rubber 58 or other material. Preferably the heat-resistant rubber be a silicon rubber, and it should be as thin as possible in consideration of heat conductance. In the fifth, sixth and seventh embodiments, a roller tube 52 that was 30 mm in diameter was used, but its diameter can be 20 to 100 mm, or preferably 25 to 50 mm.

As shown in the fifth to the seventh embodiments above, the shrinkage force generated in medium 100 is cancelled out to prevent wrinkles in medium 100 by applying a frictional force to medium 100 via the heat roller 51. Of course, here, as long as wrinkles are prevented to the extent they do not affect pressure transfer; that is, within a range that does not degrade the quality of the output image, the purpose is achieved. However, even wrinkles that do not affect pressure transfer may cause photosensitive medium to lift when transmitted from developer assembly 7 to the image exposure assembly 4, resulting in a poor latent image. For this reason, it is necessary to eliminate the effect of such wrinkles on the image exposure assembly 4, which is explained in the embodiment of the present invention below.

Figure 10:
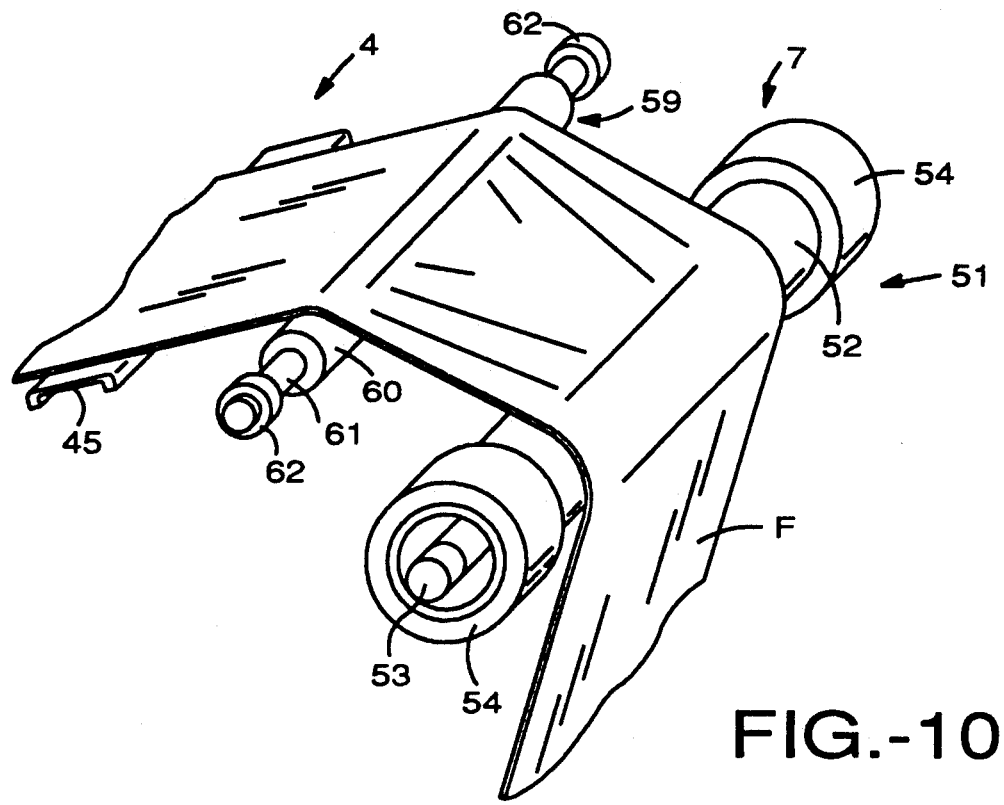
FIG. 10 is a eighth embodiment showing the vicinity of the heat roller of the developer assembly.

FIG. 10 is a eighth embodiment of the present invention showing the area of the heat roller in developer assembly. Here, the guide roller 59, which serves as a guide medium, is mounted ahead of the heat roller 51. The guide roller 59 comprises the freely rotating roller tube 60 and the support shaft 61, and it is attached to the frame (not shown) of system 1 via a pair of left and right bearings 62 and 62 on either end of the support shaft 61. Roller tube 60 is made from natural rubber, nitrile rubber, silicon rubber or other rubber material, and its peripheral surface comes in contact with medium 100, thus causing frictional force (static friction coefficient: 0.5 or greater) to act on medium 100 in the widthwise direction. Here, the transmission of wrinkles generated by the heat roller 51 is stopped by this guide roller 59, thus preventing the wrinkles from affecting the image exposure assembly 4. Therefore, lifting of medium 100 in the image exposure assembly 4 can be prevented and a good latent image can be obtained. By polishing the surface of roller tube 60 to a mirror finish, frictional force can be further increased. Also, roller tube 60 of the guide roller 59 here was 15 mm in diameter, but it can be 6 to 30 mm, or preferably 10 to 20 mm. In addition, the angle at which medium 100 is wrapped around the guide roller 59 and the tension on medium 100 should be greater than 15 degrees and greater than 6 gr/cm, respectively.

Figure 11:
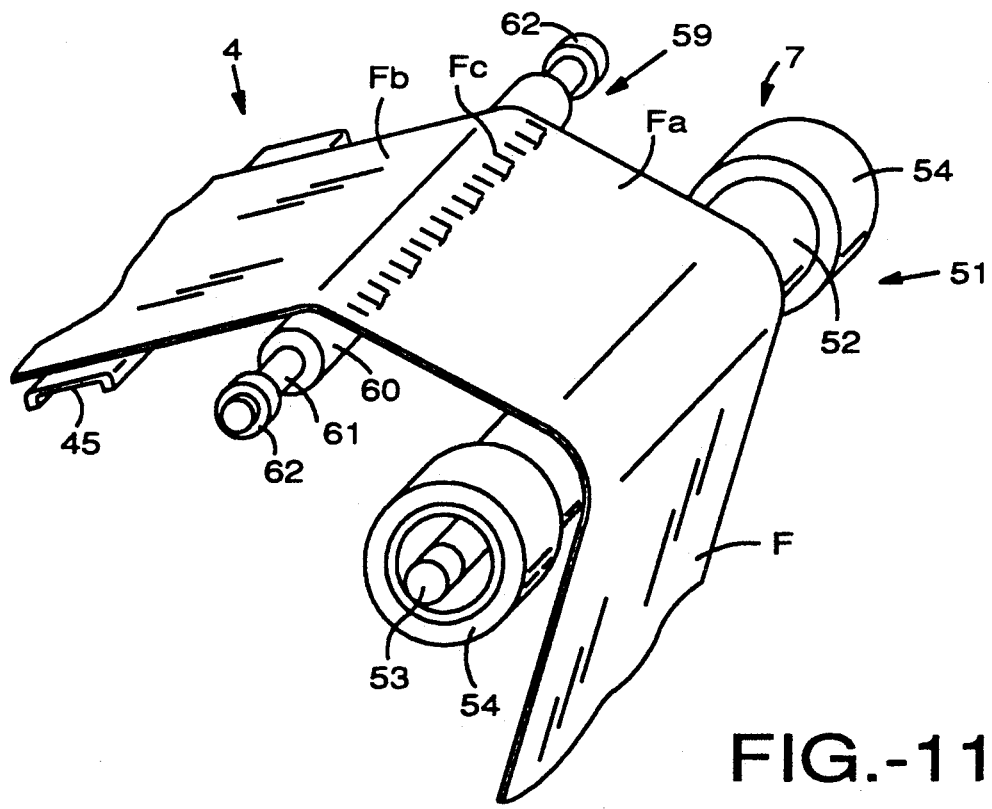
FIG. 11 is an explanatory diagram showing the rewind condition of photosensitive medium based on the eighth embodiment.

FIG. 11 is an explanatory diagram, using the eighth embodiment of the present invention as an example, of the case in which photosensitive medium is rewound. The moment medium 100 is pulled away by the movable rollers 17 and 17, it moves with wrinkles remaining in that part. That is, wrinkles have formed in medium 100 in the boundary part Fc between the exposed part Fa and the unexposed part Fb even after transfer in the transfer pressure assembly is completed and photosensitive medium is pulled back. Photosensitive medium is rewound until the boundary is positioned just downstream of guide roller 59. The rewind position should be 2 to 30 mm, or preferably 10 to 20 mm, downstream from the guide roller 59. In this way, the affect of these wrinkles is not transmitted to the image exposure assembly 4, thereby saving the latent image. The rewind method employed can be that described in the ninth embodiment of the present invention, below.

Figure 12:
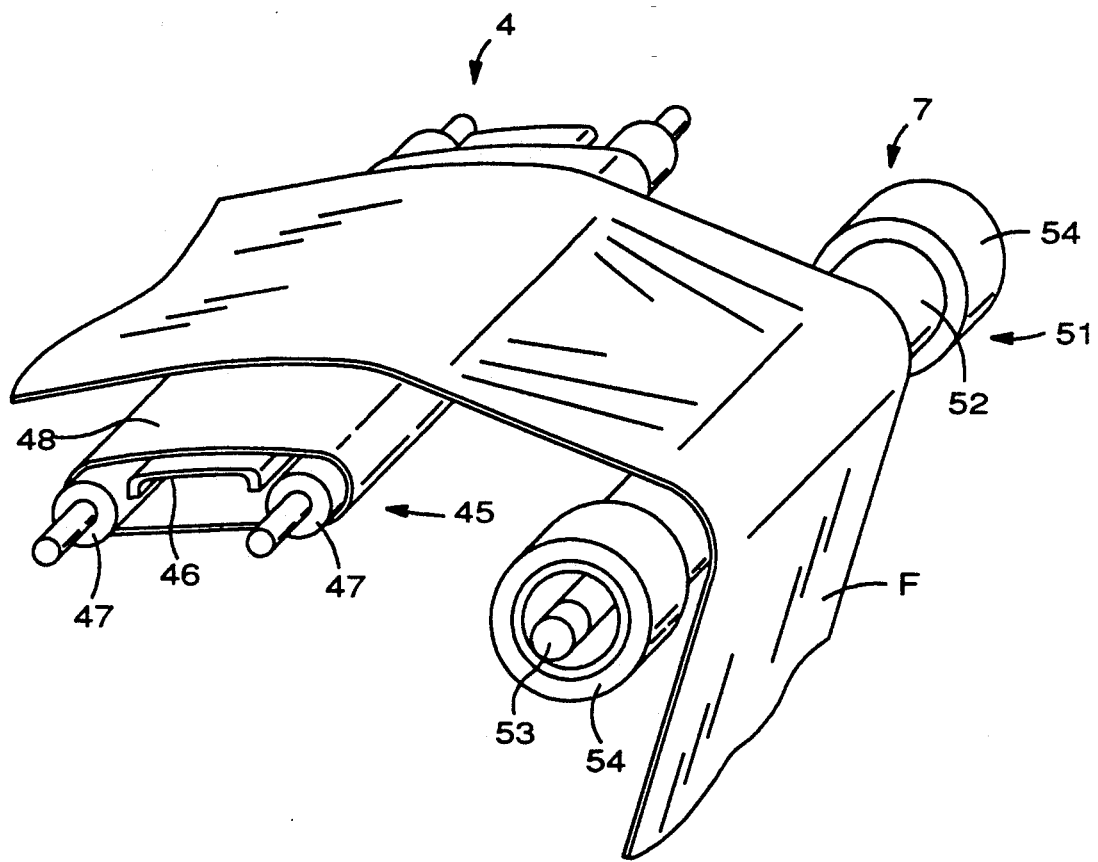
FIG. 12 is a ninth embodiment showing the vicinity of the developer assembly and the image exposure assembly.

FIG. 12 is a ninth embodiment of the present invention showing the area of developer assembly and the image exposure assembly. Here, the exposure platform 45 of the image exposure assembly 4 is configured like a conveyor belt and is positioned slightly higher than the heat roller 51. This exposure platform 45 comprises the plate-like table unit 46, the pair of roller-like pulleys 47 and 47 (supported on the frame) positioned before and after the table unit 46, and the endless wide belt 48 wrapped around roller-like pulleys 47 and 47. Since roller-like pulleys spin freely, the wide belt 48 travels over the table unit 46 according to the travel of medium 100. The wide belt 48 is made from natural rubber, nitrile rubber, silicon rubber or other rubber material, and the rear surface of medium 100 fits snugly against its surface to cause frictional force to act in the widthwise direction of medium 100. Here, since the exposure platform 45 is positioned slightly higher than the heat roller 51, transmission of wrinkles from the heat roller 51 is stopped at roller-like pulley 47 on the downstream side, and wrinkles in medium 100 on the exposure platform 45 are inhibited by the frictional force of the exposure platform 45 itself. Here, the thickness of the wide belt 48 should be greater than 0.5 mm and the tension on medium 100 greater than 10 gr/cm. The middle part of the table unit 46 can be raised slightly (radius of curvature: 50 to 500 mm) to strengthen the contact force between the wide belt 48 and medium 100 and thereby increase the frictional force.

As described above in the eighth and ninth embodiments, the effect of wrinkles on the image exposure assembly 4 is eliminated by the guide roller 59, thereby yielding a good latent image.

In the above embodiments, supply roller 22 of Supply cartridge 59, the top roller 72 of the transfer pressure assembly 8 and the takeup roller 12 of medium spooling assembly 9 made up the drive system for medium 100, but it is also desirable to provide a feed roller 18 downstream from the image exposure assembly 4 as described above. Here, supply roller 22 rewinds medium 100, the feed roller 18 controls the speed of medium 100 in the image exposure assembly 4, the top roller 72 transports medium 100 after the feed roller 18, and the takeup roller 12 rolls up the used medium 100.

Feed roller 18 is driven when an exposure begins, and medium 100 is pulled out from the box 21. The pinch roller 76 comes in contact with the top roller 72 and drive of the top roller 72 starts slightly delayed behind the drive of the feed roller 18. The takeup roller 12 is driven sequentially with the drive of the top roller 72. The exposed part of medium 100 moves to the transfer pressure assembly 8 from the image exposure assembly 4 through developer assembly 7 by the top roller 72. When the exposed part of medium 100 moves to near the transfer pressure assembly 8, roller 82 is driven and feeds out paper 102, after which paper supply roller 84 is driven and aligns paper 102 up with the exposed part of medium 100. When transfer begins, paper eject roller 92 is driven and carries the separated paper 102 to the ejected paper cassette 91, while medium 100 is rolled up on the takeup roller 12 after passing the pinch roller 76. Here, the movable rollers 17 and 17 are driven when the unexposed part of medium 100 reaches developer assembly 7 and separate medium 100 and the heat roller 51, and when photosensitive medium reaches the transfer pressure assembly, the middle and bottom rollers 73 and 74 move down and release the transfer condition. Also, all of the rollers stop when one complete copy operation is completed. As the rollers stop, the pinch roller 76 separates from the top roller 72 (condition in FIG. 1), the bottom roller 74 moves down releasing the contact between the top roller 72 and the middle roller 73, and the movable rollers 17 and 17 are driven to release the contact between medium 100 and the heat roller 51. When rewinding is performed, the clutches of the feed roller 18, pinch roller 76 and takeup roller 12 are switched to allow these rollers to turn freely, and supply roller 22 is driven in reverse and rolls medium 100 back up. Of course, the driving and stopping of each of these rollers is detected and controlled by encoders and sensors not shown in the figures.

In order to obtain high quality output images in these embodiments, medium 100 should be heated to a developing temperature of 150°±3° C. in developer assembly 7 and then reduced to 70°±3° C. in the transfer pressure assembly 8. If photosensitive medium 100 is heated to 70° C. after it has been cooled from 150° C. to below 70° C., thermal stresses can cause thermal expansions in medium 100, resulting in wrinkles. Such wrinkles can be prevented, and the structure can be simplified by allowing medium 100 to cool naturally to 70° C. by the time it reaches the transfer pressure assembly 8. The movement speed of medium 100 and the distance from developer assembly 7 to the transfer pressure assembly 8 are set such that $T/t > 10°$ C./s, where T is the difference between the developing temperature and the transfer temperature and t is the movement time from developer assembly 7 to the transfer pressure assembly 8. Of course, the movement speed is determined by the top roller 72 of the transfer pressure assembly 8, but since there are restrictions on the exposure speed and the retention time of the developing temperature, the drop in temperature is mainly adjusted by the distance between the heat roller 51 and the transfer roller 71 of the transfer pressure assembly. In this way, the experimental results in plate 2 can be satisfied while preventing transfer wrinkles.

Figure 13:
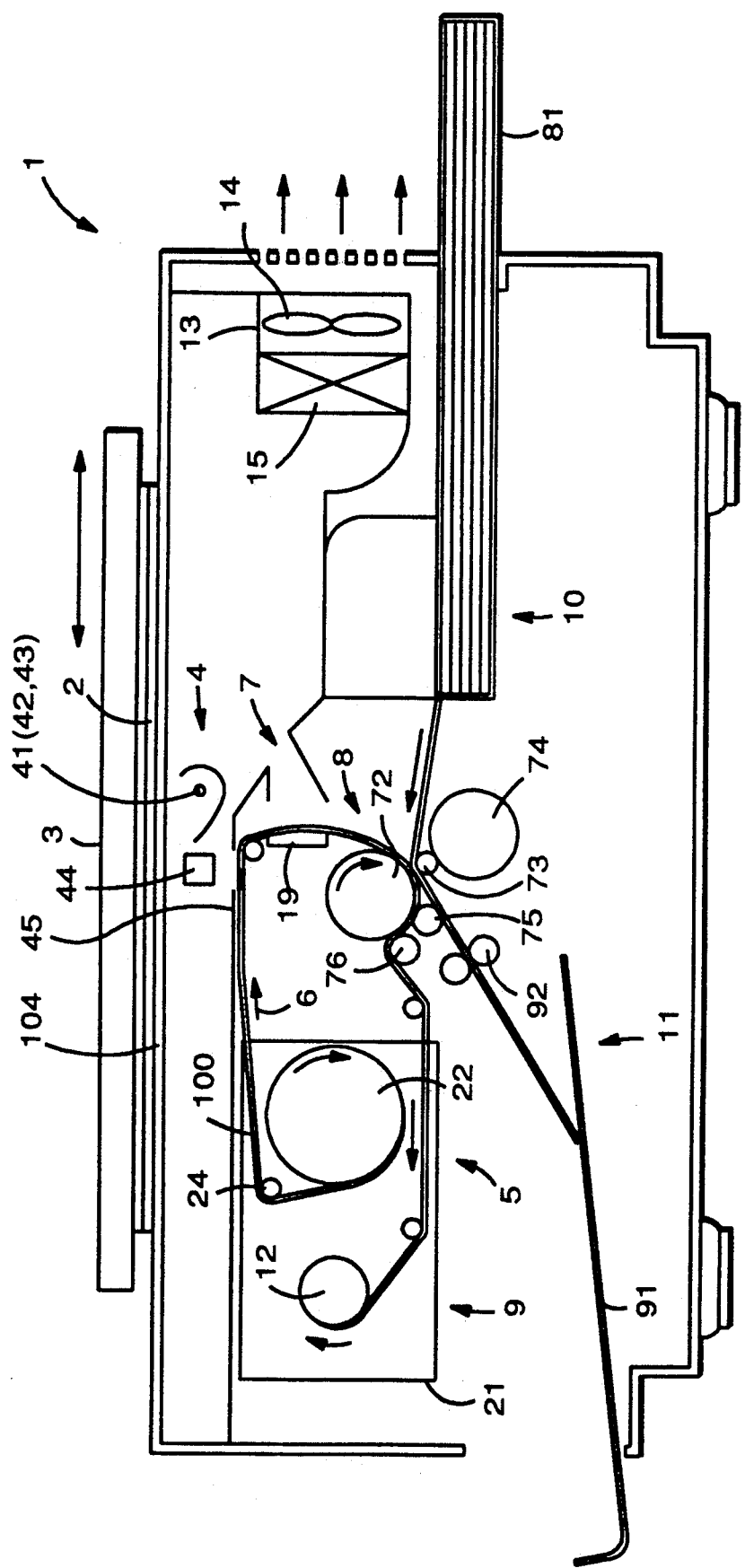
FIG. 13 is a cutaway view of another embodiment of a color image formation device in which the present invention is implemented.

FIG. 13 represents another image formation device according to an alternative embodiment of the present invention. Supply roller 22 and takeup roller 12 are inside box 21. Besides heat roller 51, there is a heating plate 19 with a curved heating surface. Plate 19 has an aluminum plate with a built-in platter-like heater. Developing is done by sliding photosensitive material over the surface.

The above explanations concerned a color copier, but the present invention is not so limited, and can be used to advantage in printers, plotters, facsimile machines, electronic cameras and other devices.

While the present invention has been described in conjunction with several specific embodiments, it is evident to those skilled in the art that many further alternatives, modifications and variations will be apparent in light of the forgoing description. Thus, the present invention described herein is intended to embrace all such alternatives, modifications, applications and variations as may fall within the spirit and scope of the appended claims.

What is claimed is:

1. An image formation device for use in transporting a film type photosensitive member, having a front and a rear surface, from a supply source along a transport path sequentially through exposure, heat developing, and pressure transfer sections, so as to first form a latent image on the front surface, heat develop the latent image, and then transfers it to a transfer member within the pressure transfer section; comprising:
   a heating member in the heat developing section mounted to come into contact with the photosensitive member on a rear surface opposite said image and heat the photosensitive member, said heating member having a curved surface that comes into direct contact with the photosensitive member and regulates stretching and shrinkage of the photosensitive member through application of frictional force generated between it and the photosensitive member, and imparting a change in a relative transport direction greater than ninety degrees for said photosensitive member during passage over said curved surface.

2. The image formation device of claim 1 further comprising a charger unit disposed adjacent said roller which is configured to apply an electrostatic charge to said photosensitive medium and an attraction to said heating member.

3. The image formation device of claim 1 further comprising a guide member that comes into direct surface contact with said photosensitive member, and regulates stretching and shrinkage of the photosensitive member using frictional force, disposed between said exposure and heat developing sections.

4. The image formation device of claim 1 further comprising a guide member that comes into direct surface contact with said photosensitive member, and regulates stretching and shrinkage of the photosensitive member using frictional force, disposed adjacent said pressure section.

5. The image formation device of claim 4, wherein:
   the guide member is a freely rotating roller whose surface, at least, is covered with a rubber material.

6. The image formation device of claim 1 wherein the curved friction surface of the heating member comprises a metal roller with a polished surface.

7. The image formation device of claim 1, wherein:
   the curved friction surface of the heater comprises a roller made from a heat conductive medium whose surface is covered with a heat resistant rubber.

8. The image formation device of claim 1 wherein the exposure section comprises a guide member that comes into direct contact with the photosensitive member and regulates stretching and shrinkage of the photosensitive member by means of frictional force generated between it and the photosensitive member.

9. The image formation device of claim 8, wherein:
   the guide member comprises a belt type exposure platform whose surface, at least, comprises a rubber material and which can rotate with the travel of photosensitive medium.

10. The image formation device of claim 9 wherein said exposure table is configured with at least a slight arcuate shape, being higher in the middle than on entrance and exit ends, so as to apply tension to said photosensitive member as it passes through.

11. An image formation device for use in transporting a film type photosensitive member, having a front and a rear surface, from a supply source along a transport path sequentially through exposure, heat developing, and pressure transfer sections, so as to first form a latent image on the front surface, heat develop the latent image, and then transfers it to a transfer member within the pressure transfer section; comprising:
   a tensioning member having a curved surface that comes into direct contact with the photosensitive member and regulates stretching and shrinkage of the photosensitive member through application of frictional force, and imparts a relative change in transport direction for said photosensitive member greater than ninety degrees during passage over said curved surface.

12. The image formation device of claim 11 wherein said tensioning member comprises:
   at least one guide roller positioned in surface contact with said photosensitive member; and
   torque limiting means coupled to said roller so as to inhibit a rate of rotation for said roller to a predetermined value in response to passage of said photosensitive member over at least a portion of a surface thereof.

13. The image formation device of claim 12 comprising at least two rollers.

14. The image formation device of claim 12 wherein said at least one guide roller comprises cylindrical roller surface positioned a predetermined radial distance from a central roller axis, with said radial distance varying so that it is slightly larger in a middle portion of said roller than near outer ends of said roller.

15. The image formation device of claim 12 wherein said at least one guide roller comprises cylindrical roller positioned so as to float on said photosensitive member between at least two other guide rollers and press downward under the effects of gravity so as to alter a transport path of said photosensitive member and increase tension therein.

* * * * *

UNITED STATES PATENT AND TRADEMARK OFFICE
CERTIFICATE OF CORRECTION

PATENT NO. : 5,283,611
DATED : February 1, 1994
INVENTOR(S) : Kobayashi, et al

It is certified that error appears in the above-indentified patent and that said Letters Patent is hereby corrected as shown below:

On the Title Page, Item [75], "Atushi" should read —Atsushi—.

Signed and Sealed this

Twenty-seventh Day of December, 1994

Attest:

BRUCE LEHMAN

Attesting Officer

Commissioner of Patents and Trademarks